United States Patent [19]

Teramoto

[11] Patent Number: 5,620,910
[45] Date of Patent: Apr. 15, 1997

[54] METHOD FOR PRODUCING SEMICONDUCTOR DEVICE WITH A GATE INSULATING FILM CONSISTING OF SILICON OXYNITRIDE

[75] Inventor: Satoshi Teramoto, Kanagawa, Japan

[73] Assignee: Semiconductor Energy Laboratory Co., Ltd., Kanagawa-ken, Japan

[21] Appl. No.: 494,560

[22] Filed: Jun. 22, 1995

[30] Foreign Application Priority Data

Jun. 23, 1994 [JP] Japan .................................... 6-165931

[51] Int. Cl.$^6$ ........................ H01L 21/318; H01L 21/84
[52] U.S. Cl. ........................ 438/151; 438/909; 438/762; 438/771; 438/591
[58] Field of Search ............................... 437/21, 40 TFT, 437/40 TFI, 41 TFT, 41 TFI, 173, 907, 908, 42, 235, 238, 240, 241; 148/DIG. 3, DIG. 4, DIG. 90, DIG. 43, DIG. 114, DIG. 118

[56] References Cited

U.S. PATENT DOCUMENTS

| 4,950,624 | 8/1990 | Inuzima et al. ................. 148/DIG. 43 |
| 5,147,826 | 9/1992 | Liu et al. . | |
| 5,264,396 | 11/1993 | Thakur et al. ........................ 437/241 |
| 5,275,851 | 1/1994 | Fonash et al. . | |
| 5,306,651 | 4/1994 | Masumo et al. ................. 437/40 TFT |
| 5,352,291 | 10/1994 | Zhang et al. ................................ 117/8 |
| 5,424,230 | 6/1995 | Wakai ............................... 437/40 TFT |
| 5,455,453 | 10/1995 | Harada et al. ........................ 257/675 |

FOREIGN PATENT DOCUMENTS

| 56-23748 | 3/1981 | Japan .............................. 148/DIG. 93 |
| 63-72131 | 4/1988 | Japan ...................................... 437/241 |
| 63-299322 | 12/1988 | Japan ...................................... 437/241 |
| 1-107547 | 4/1989 | Japan ...................................... 437/241 |
| 4-12330 | 1/1992 | Japan . | |
| 4-304677 | 10/1992 | Japan . | |

OTHER PUBLICATIONS

R. Kakkad et al., "Crystallized Si films by low–temperature rapid thermal annealing of amorphous silico," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

C. Hayzelden et al., "In Situ Transmission Electron Microscopy Studies of Silicide–Mediated Crystallization of Amorphous Silicon" (3 pages).

(List continued on next page.)

*Primary Examiner*—Charles L. Bowers, Jr.
*Assistant Examiner*—Leon Radomsky
*Attorney, Agent, or Firm*—Sixbey, Friedman, Leedom & Ferguson, P.C.; Gerald J. Ferguson, Jr.; Jeffrey L. Costellia

[57] ABSTRACT

In an insulated gate type field effect semiconductor device having a thin silicon semiconductor film, the gate insulating film that covers the active layer is a thin film consisting essentially of silicon, oxygen and nitrogen. In the gate insulating film in the device, the nitrogen content is made the largest in the interface between the film and the adjacent gate electrode, and the material constituting the gate electrode is prevented from being diffused into the gate insulating film. In the film, the nitrogen content is made the largest in the interface between the film and the adjacent active layer, and hydrogen ions, etc. are prevented from being diffused from the active layer into the gate insulating film. Prior to the formation of the gate insulating film, the surface of the active layer is irradiated to laser rays or intense rays comparable to laser rays, so as to be oxidized or nitrided.

18 Claims, 10 Drawing Sheets

OTHER PUBLICATIONS

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–like Crystallization of Ni Doped Amorphous Silicon Thin Films", *Solid State Communications,* vol. 85, No. 11, pp. 921–924, 1993.

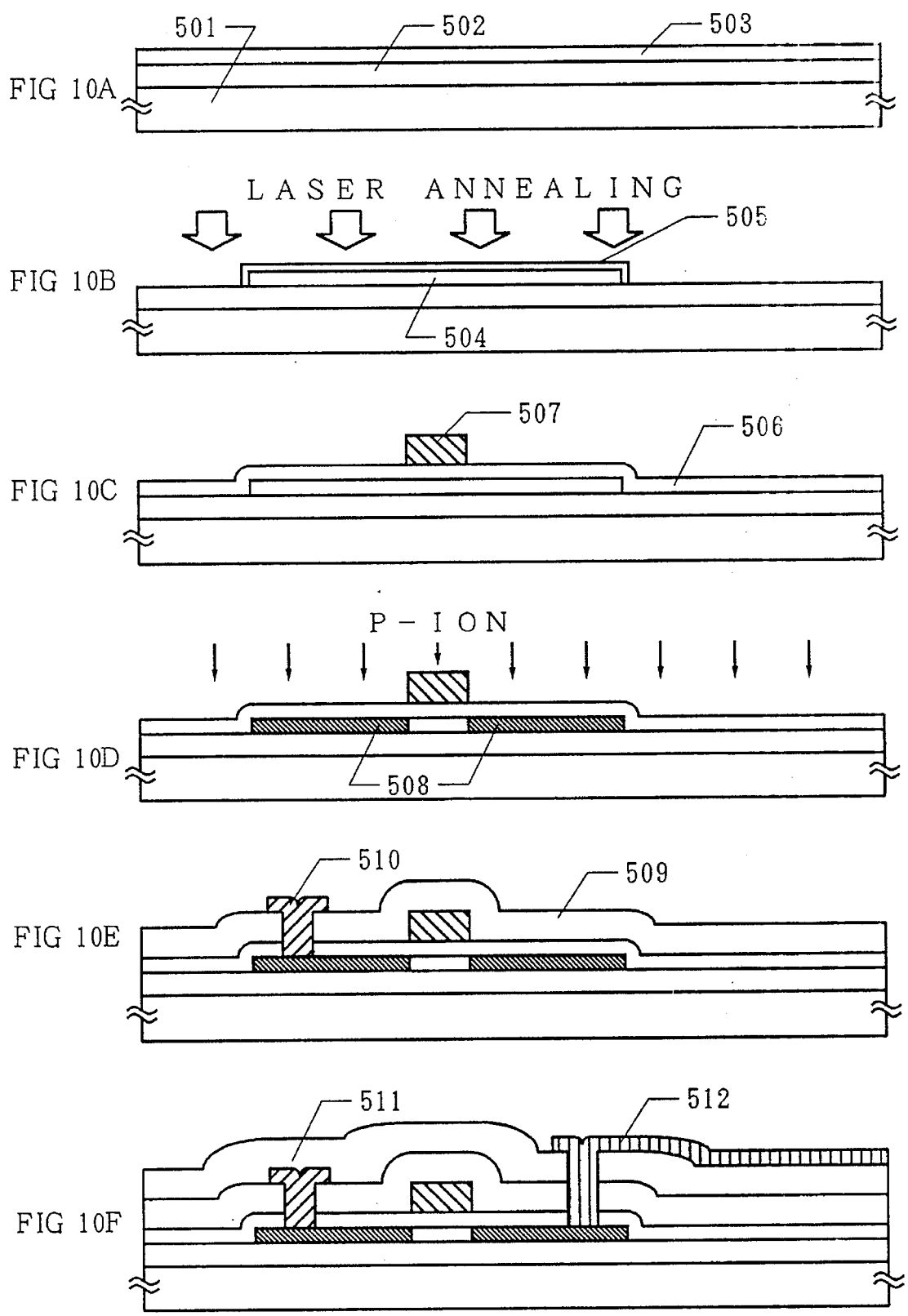

METHOD FOR PRODUCING SEMICONDUCTOR DEVICE WITH A GATE INSULATING FILM CONSISTING OF SILICON OXYNITRIDE

BACKGROUND OF THE INVENTION

The present invention relates to a structure of an insulated gate type field effect semiconductor device (generally referred to as a thin film transistor or TFT) having a thin film semiconductor formed on an insulating substrate, and also to a method for producing the device.

Heretofore has been known an insulated gate type field effect semiconductor device (hereinafter referred to as TFT) having a thin film semiconductor formed on an insulating substrate (especially, glass substrate). Such TFT formed on an insulating substrate is used in various devices such as liquid crystal display devices, image sensors, etc.

In the TFT, generally used is silicon dioxide ($SiO_2$) as the gate insulating film.

It is necessary to use a crystalline silicon film as the active layer in TFT so as to obtain high level characteristics. To produce such crystalline silicon film, there are known a method of directly forming a silicon film having a microcrystalline structure by thermal CVD (chemical vapor deposition) under reduced (low) pressure or the like, a method of making an amorphous silicon film crystalline by heating it or by irradiation of laser rays thereto, etc.

In any of these methods, however, it is impossible to obtain a monocrystalline structure at present. In other words, the crystalline silicon film to be obtained by any of said methods has a polycrystalline structure or microcrystalline structure, or has a mixed structure comprising a crystalline structure and an amorphous structure, or even has a composite structure partly containing a crystalline structure.

Since the above mentioned crystalline structures have many dangling bonds of silicon, it is necessary to introduce hydrogen into the active layer so as to neutralize (or terminate) said dangling bonds. In other words, it is necessary to hydrogenate the active layer.

However, the existence of hydrogen in the gate insulating film in TFT must be evaded as much as possible. This is because mobile ions, if any, in the gate insulating film in driving TFT cause hysteresis or variation in the threshold value.

When a conventional TFT is formed on a glass substrate, the whole device is often charged with static electricity, thereby causing a problem in that the gate insulating film is damaged by dielectric breakdown due to the static electricity. More concretely, there was a problem in that a high voltage is applied to the whole device via the gate insulating film due to the charging of the device with static electricity and, as a result, the gate insulating film becomes undurable to the voltage.

The above problem is considered to be caused by the reasons that the energy band gap (Eg) in the silicon dioxide ($SiO_2$) film is large to be about 8 eV while the relative dielectric constant of the film is relatively small to be about 3.8.

In place of the silicon dioxide film, a silicon nitride ($Si_3N_4$) film having Eg of about 5 eV and a relative dielectric constant of about 7 as the gate insulating film may be used. However, if such silicon nitride film is used as the gate insulating film, the Si cluster is to be a charge capture center so that hysteresis occurs in the C-V (capacitance-voltage) characteristic. Also, in the B-T (bias-temperature) treatment, there occurs another disadvantage in that a threshold voltage $\Delta V_{th}$ is shifted by about 10 V. If such silicon nitride film is used as the gate insulating film, the insulating film have a charge capture center in itself. Therefore, silicon nitride is unfavorable to be formed into a gate insulating film.

The active layer is required to contain hydrogen. When the active layer contains hydrogen, however, there occurs another problem in that the hydrogen in said active layer diffuses out into the adjacent gate insulating film.

Such is contradictory to the requirement that the gate insulating film adjacent to the active layer shall not contain hydrogen.

When a material consisting essentially of metal is employed as the material of the gate electrode, there occurs still another problem in that said metal material is alloyed with the semiconductor component constituting the gate insulating film.

SUMMARY OF THE INVENTION

The object of the present invention is, (1) to provide a gate insulating film which is hardly damaged by electrostatic breakdown due to static electricity, and (2) to provide a gate insulating film which hardly has a charge capture center in itself.

Another object of the present invention is to provide a gate insulating film into which the ions existing in the active layer are not diffused from the active layer.

Still another object of the present invention is to provide a structure comprising a gate electrode containing components of a metallic material and a gate insulating film, in which the metal components of the gate electrode are not diffused into the gate insulating film.

One embodiment of the present invention is an insulated gate type field effect semiconductor device, in which the gate insulating film is essentially composed of silicon, oxygen and nitrogen and is characterized in that the composition ratio of N (nitrogen) is varied in the direction of the thickness of the film, or is an insulated gate type field effect semiconductor device, in which the gate insulating film is composed of a material of SiOxNy and is characterized in that the composition ratio of N is varied in the direction of the thickness of the film. In particular, it is useful to form TFT having the above mentioned structure on an insulating substrate so as to prevent the structure from being damaged by electrostatic breakdown due to static electricity.

The phrase "essentially composed of . . . " as referred to herein means that the content of the atom is 5 atom % or more. In other words, the phrase "essentially composed of silicon, oxygen and nitrogen" means that the gate insulating film contains silicon, oxygen and nitrogen each in an amount of 5% or more. The same shall apply to the structure of the gate insulating film doped with nitrogen.

The above gate insulating film of the present invention is further characterized in that it contains chlorine (Cl).

The present invention is also characterized in that a vapor phase process using, as a raw material gas, chlorosilane or dichlorosilane is employed to add chlorine to the SiOxNy film to thereby introduce chlorine to the film.

The material of SiOxNy has an energy band gap of from 5.3 to 7.0 eV and a relative dielectric constant of 4 to 6, where $0<x<2$ and $0<y<4/3$. In this material, x and y can be varied depending on the conditions for producing it and can be defined according to the practical embodiments. It is necessary that the material contains O (oxygen) in an amount of 1 atomic % or more, preferably 10 atomic % or more, and N (nitrogen) in an amount of 0.001 atomic % or more, preferably 0.1 atomic % or more.

To produce the material of SiOxNy, employable are various vapor phase methods, such as plasma CVD (PCVD) (13.56 MHz), low pressure CVD (LPCVD), photo-CVD, PCVD to which pulse waves are applied, etc.

The insulating film of SiOxNy may contain, if desired, any other halogen elements and impurities to be introduced by intentional doping.

Another embodiment of the present invention is a structure of a thin gate insulating film made of SiOxNy, in which the composition ratio of N (nitrogen) is made the largest in the interface(s) between the film and the gate electrode and/or between the film and the active layer.

In this structure, the composition ratio of N (nitrogen) in the thin film of SiOxNy is made the largest in the interface(s) between the film and the gate electrode and/or between the film and the active layer, which includes the following cases. FIGS. 4 to 6 are referred to, which indicate the relationship between the composition ratio of N (nitrogen) (vertical axis) in a gate insulating film of SiOxNy and the position in the direction of the thickness of the film.

FIG. 4 shows one embodiment where the composition ratio of N is made the largest in the interface between the gate insulating film and the adjacent active layer. FIG. 5 shows another embodiment where the composition ratio of N (nitrogen) is made the largest in the interface between the gate insulating film and the gate electrode. FIG. 6 shows still another embodiment where the composition ratio of N (nitrogen) is made the largest in the interface between the gate insulating film and the active layer and also in the interface between the gate insulating film and the gate electrode. The phrase "the largest" represents that the composition ratio is relatively the largest.

Even if the active layer contains metal elements that promote the crystallization of silicon in the above mentioned structure, the diffusion of these metal elements from the active layer into the gate insulating film is prevented since the composition ratio of N (nitrogen) is the largest in the interface between the gate insulating film and the active layer. This is because the largest composition ratio of N (nitrogen) may give a barrier layer of Si—N (silicon-nitrogen) bonds in the interface between the gate insulating film and the active layer.

The above mentioned metal elements must be those invasive to silicon. Concretely, these metal elements include Ni (nickel), Fe (iron), Co (cobalt), Ru (ruthenium), Pd (palladium), Os (osmium), Ir (iridium), Pt (platinum), Cu (copper), Ag (silver) and Au (gold). One or more of them can be employed in the present invention.

These metal elements are diffused into silicon film during heat treatment. While these invasive elements are diffused into the film, the silicon of the film is crystallized at the same time. Concretely, while being diffused, these invasive elements catalytically act everywhere to promote the crystallization of amorphous silicon film.

Since the above invasive elements are rapidly diffused into silicon film, the amount of these to be introduced or added to the film is an important factor. Concretely, if the amount of the elements introduced is too small, the effect of the elements to promote the crystallization of silicon is poor so that good crystallinity cannot be obtained. If the amount is too large, the semiconductor characteristics of silicon are deteriorated.

Therefore, the optimum range of the amount of the metal elements to be introduced into amorphous silicon film is an important factor. When Ni (nickel) is used as the metal element to promote the crystallization of silicon in amorphous silicon film, the amount of the Ni element to be introduced into the amorphous silicon film shall be so controlled that the content of Ni in the crystallized silicon film is to be $1 \times 10^{15}$ cm$^{-3}$ or more, whereby the Ni that has been introduced into the amorphous silicon film can exhibit its effect to promote the crystallization of silicon in the film. On the other hand, it is known that, when the amount of Ni to be introduced is so controlled that the content of Ni in the crystallized silicon film is to be $1 \times 10^{19}$ cm$^{-3}$ or less, then the semiconductor characteristics of the crystallized silicon are not deteriorated. The content of silicon is defined by the minimum value to be obtained by SIMS (secondary ion mass spectrometry).

Metal elements other than Ni referred to hereinabove may also exhibit their effect when they are used within the same range as above.

In addition to the above metal elements, Al and Sn can also promote the crystallization of amorphous silicon film. However, Al (aluminum) and Sn (tin) alloy with silicon so that they are not diffused into silicon film. In the case where Al or Sn is introduced into amorphous silicon film, it alloys with silicon to form a crystalline nucleus, from which silicon crystals grow. In this way, when Al or Sn is introduced into amorphous silicon film, silicon crystals grow only from the part into which Al or Sn has been introduced, namely, only the alloy layer composed of the element and silicon. Therefore, this case where Al or Sn is used involves a problem in that the crystallinity of silicon is generally poor, as compared with the case where any of the above mentioned invasive elements such as Ni is used. For example, the former case involves a problem in that it is difficult to obtain a crystalline silicon film that has uniformly crystallized when Al or Sn is used. In addition to this problem, there are still other problems in that the alloy layer is a bar to the production of devices and that the alloy layer itself lowers the reliability of devices.

Since SiOxNy has Eg of 5.3 to 7.0 and a relative dielectric constant of 4 to 6, it can pass therethrough Fowler-Nordheim current (tunnel current via insulating film) which is higher by about ten times than that capable of passing through silicon oxide film so that it is prevented from being electrostatically broken down.

Since the SiOxNy film which is the gate insulating film contains oxygen, this oxygen acts to remove hysteresis. In addition, N (as SiN bond) in this film acts to prevent Na ions and heavy metal ions, such as Fe, Ni and Co ions, from drifting through the film.

When chlorine (Cl) is added to the film, it can neutralize or fix Na ion and Fe ion as NaCl and FeCl and, in addition, it can inhibit the negative influence of impurity ions on the gate insulating film.

In the gate insulating film of SiOxNy, since the composition ratio of N (nitrogen) in the direction of the thickness of the film is varied, a barrier layer can be formed at any site in the direction of the thickness of the film. In particular, since the composition ratio of N is made the largest in the interface between the gate insulating film of SiOxNy and the adjacent active layer, a barrier layer can be formed in the interface. Due to the action of this barrier layer, it is possible to prevent hydrogen ions and metal ions, which are being diffused from the active layer, from invading the gate insulating layer.

Since the composition ratio of N is made the largest in the interface between the gate insulating film of SiOxNy and the adjacent gate electrode, a barrier layer can also be formed in the interface. Due to the action of this barrier layer, it is possible to prevent the components constituting the gate electrode from invading the gate insulating layer.

In order to further augment the effect of the present invention, it is recommended to oxidize the surface of the active semiconductor layer by irradiating it to lasers or the like intense rays comparable to lasers in an oxidizing or nitriding atmosphere (hereinafter referred to as photo-annealing) before forming the gate insulating film thereon.

The irradiation of the layer to laser rays or the like intense rays comparable to lasers in a nitriding or oxidizing atmosphere is to form a nitride film, an oxide film or a nitridoxide film on the surface of the non-monocrystalline (or non-single crystalline) semiconductor film while improving the crystallinity of the non-monocrystalline semiconductor film. The oxidizing atmosphere is an atmosphere containing a large amount of oxidizing gas, in which the film is positively oxidized. As examples, mentioned are an atmosphere containing a large amount of oxygen, ozone, nitrogen suboxide ($N_2O$), nitrogen dioxide ($NO_2$) or the like, and mixed atmospheres comprising these. Therefore, the oxidizing atmosphere is different from an atmosphere merely containing a minor amount of such oxidizing gas. The oxidizing atmosphere may additionally contain chlorine, trichloroethylene (trichlene, TCE, $CHCl=CCl_2$), trans-1,2-dichloroethylene ($CHCl=CHCl$), etc. These additional gases promote oxidization.

Where an active layer composed of silicon is subjected to such photo-annealing, a thin silicon oxide film or silicon nitride film is formed on the surface of the silicon film of the layer. In particular, when the layer is irradiated to ultraviolet rays, the chemical reaction occurring in the layer is promoted to form a good silicon oxide film on the layer. The silicon oxide film thus formed has a few fixed charges and a low surface standard density ($Q_{ss}$) and is almost comparable to a silicon oxide film to be obtained by thermal oxidation in ordinary dry oxygen at a temperature falling between 1000° C. and 1200° C. For these reasons, the silicon oxide film is excellent as the gate insulating film in insulated gate type devices such as TFT, etc.

After this photo-annealing, an insulating film, for example, a silicon nitridoxide film, is formed by a filming method according to the present invention, for example, by a plasma CVD method or the like. In this way, the insulating film having a necessary thickness can be formed over the oxide film or nitride film having good interfacial characteristics, that has been formed on the surface of the semiconductor layer by the previous exposure of the layer to laser rays or the like.

It is desirable that the filming process mentioned above is all the way conducted in an atmosphere substantially shielded from air. If once the surface of the semiconductor layer is exposed to air, after having been irradiated to laser rays, etc., the surface is contaminated in air with the result that the good oxide film, etc. formed on the surface by its exposure to laser rays, etc. become useless. Therefore, a step of exposing the surface of the semiconductor layer to air should not be inserted between the step of exposing the surface of the layer to laser rays, etc. and the step of forming an insulating film on the surface of the layer by a gaseous growth process. Therefore, the present invention needs a particular means for directly transporting the substrate from the apparatus for the former step to the apparatus for the latter step, without exposing the substrate to air therebetween.

BRIEF DESCRIPTION OF THE DRAWINGS

FIGS. 10A to 10F show sectional views of the TFT produced in Example 10 and explains the production steps;

DETAILED DESCRIPTION OF THE PREFERRED EMBODIMENTS

[EXAMPLE 1]

Figure 1A:
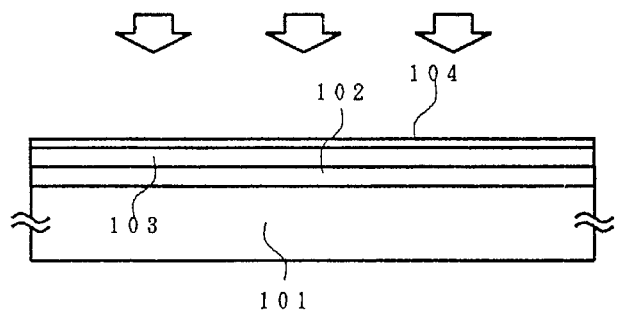
FIGS. 1A to 1E show sectional views of the TFT produced in Example 1 and explains the production steps.
Figure 1B:
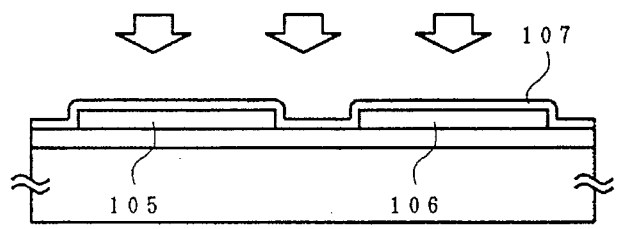

FIGS. 1A to 1E are sectional views of a thin film transistor (TFT) to be produced in this example according to the present invention. A base film 102 of silicon oxide having a thickness of 1000Å to 3000Å is formed on a glass substrate 101 (Corning 7059; 300 mm×300 mm or 100 mm×100 mm). This silicon oxide film contains chlorine, by which the influence of mobile ions such as Na ions and heavy metal ions on this film is inhibited.

To form this oxide film, both sputtering in an oxygen atmosphere and a method of decomposing and depositing TEOS (tetraethyl oxysilicate) by plasma CVD (chemical vapor deposition) followed by annealing the deposited film at 450° C. to 650° C. are employable. To add chlorine to the film, chlorine may be added to the atmosphere or, if the sputtering is employed, it may be added to the target.

An amorphous silicon film 103 is deposited on the film 102 by plasma CVD (PCVD) or low pressure CVD (LPCVD), at a thickness of 300Å to 1500Å, preferably 500Å to 1000Å. This amorphous silicon film 103 is to be active layers for a source region, a channel forming region and a drain region.

If a TFT having an amorphous silicon film is intended to be formed, a gate insulating film may be formed on this amorphous silicon film 103. If, on the other hand, a crystalline silicon film is intended to be used, the amorphous silicon film 103 is crystallized by thermal annealing (preferably conducted at a temperature not higher than 600° C.) or by irradiating with laser rays. To crystallize the film, it is effective to cover the silicon film with a protective film 104 of silicon oxide or the like, by which the silicon film is protected from contamination.

The silicon film 103 to be active layers is patterned to form active layers 105 and 106. An SiOxNy film 107 to be a gate insulating film is formed to cover the active layers 105 and 106 at a thickness of 200Å to 1500Å. The SiOxNy film has a relative dielectric constant of 4 to 6, which is larger by about 50% than the relative dielectric constant to obtain the same electric condition, the thickness of the SiOxNy film may be larger by 50% than that of a silicon oxide film. Since the thickness of the gate insulating layer may be made larger under the same electric condition if the SiOxNy film is used, the SiOxNy film is more advantageous than a silicon oxide film in view of the dielectric strength (when the same voltage is applied to films each having a different thickness, the thicker film yields a weaker electric field) and of the problem of how to prevent electric leakage via pin holes.

To form this SiOxNy film, employed is a PCVD method where chlorosilane or dichlorosilane is used as the raw material gas. Regarding the conditions for the method, the temperature of the substrate is 300° C. to 600° C. and a high frequency of 13.56 MHz is used as the high frequency energy to be applied thereto. A glass substrate such as typically Corning 7059 generally has a glass transition point of 600° C. to 900° C., and it is desirable that the process temperature is lower than 600° C.

When dichlorosilane ($SiH_2Cl_2$) is used as the raw material gas, this is mixed with ammonia ($NH_3$) and nitrogen monoxide ($N_2O$). As a result of the vapor phase reaction, SiOxNy, HCl and $H_2O$ are formed, and an SiOxNy film containing Cl (chlorine) is obtained. When chlorosilane is used as the raw material gas, Cl is also introduced into the film formed in the same manner as in the previous case where chlorosilane is used.

To form this SiOxNy film 107, also employable are PCVD where a pulse voltage is applied, LPCVD and even photo CVD.

If desired, the substrate is annealed in a hydrogen atmosphere at 350° C. for 2 hours to improve the interfacial characteristics between the active layers 105 and 106 and the gate insulating film 107.

Figure 1C:
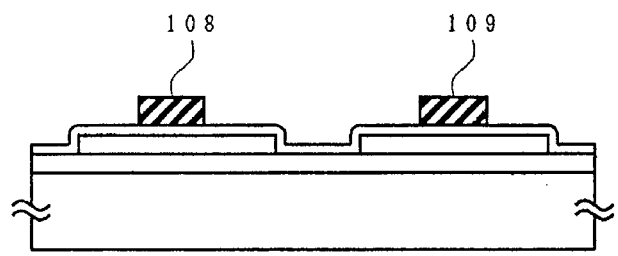

An aluminum film having a thickness of 2000Å to 5 μm is formed by electron beam vapor deposition and is patterned to form gate electrodes 108 and 109, as shown in FIG. 1C.

After this, mono-conductive impurities are implanted into the island silicon film in each TFT by ion doping in a self-alignment, using the gate electrodes as masks. To conduct the implantation, phosphorus is first implanted into the whole surface, using phosphine ($PH_3$) as a doping gas, and thereafter only the island region 105 is coated with a photoresist and boron is implanted into only the island region 106 using diborane ($B_2H_6$) as a doping gas. The dose of phosphorus is $2\times10^{15}$ to $8\times10^{15}$ $cm^{-2}$, and that of boron is $4\times10^{15}$ to $10\times10^{15}$ $cm^{-2}$. The dose of boron is made higher than that of phosphorus.

Figure 1D:
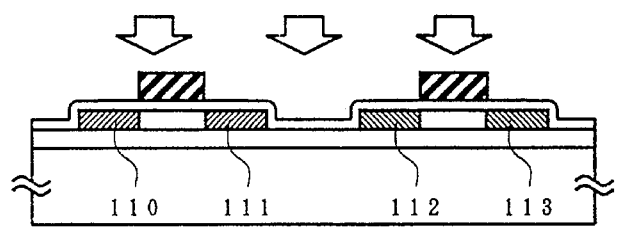

Next, in FIG. 1D, KrF excimer laser (having a wavelength of 248 nm and a pulse width of 20 nsec) is irradiated to the substrate, by which the crystallinity of the parts deteriorated due to the implantation of the above impurity regions thereinto is improved and the impurities implanted are activated. The energy density of the laser is 200 to 400 $mJ/cm^2$, preferably 250 to 300 $mJ/cm^2$.

In this way, N-type impurity regions 110 and 111 and P-type impurity regions 112 and 113 are formed. The sheet resistivity of these regions is 200 to 800$\Omega/cm^2$.

After this, an interlayer insulating film 114 of silicon oxide having a thickness of 3000Å is formed on the whole surface, using TEOS as the raw material by plasma CVD with oxygen or by low pressure CVD or atmosphere pressure CVD with ozone. In this step, the temperature of the substrate is 150° C. to 400° C., preferably 200° C. to 300° C.

Figure 1E:
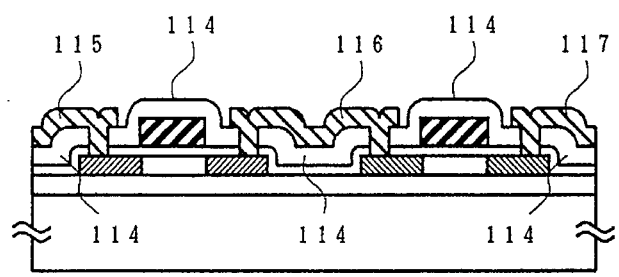

Next, contact holes are formed at the source/drain of each TFT, and aluminum wires 115 to 117 are provided. In FIG. 1E, the left-sided NTFT (N-channel thin film transistor) and the right-sided PTFT (P-channel thin film transistor) form an invertor circuit.

When the silicon film 103 is crystallized by thermal annealing, the mobility of NTFT is 50 to 100 $cm^2/Vs$ and that of PTFT is 30 to 100 $cm^2/Vs$. In this example, the highest process temperature throughout the process is not higher than 600° C. Therefore, when non-alkali glass such as Corning 7059 or the like is used as the substrate, the substrate is neither contracted nor warped. Even if a large size substrate is used, the patterns formed thereon are not disordered. The process of this example is advantageously applied to the production of large area displays and also to the driving circuits for such large area displays.

[EXAMPLE 2]

FIGS. 2A to 2E show the outline of the production steps of this example. This example is to demonstrate the production of TFT to be used for driving the pixels in active matrix type liquid crystal display devices.

As the substrate 201, a glass substrate of Corning 7059 (thickness: 1.1 mm, size: 300 mm×400 mm) is used. This glass substrate is coated with a silicon nitride film 202 having a thickness of 50 to 500Å, preferably 50 to 200Å, formed by plasma CVD on the entire surfaces in order that impurities such as sodium, etc. do not diffuse from the glass substrate into TFT.

A base film 203 of silicon oxide is formed on the glass substrate. An amorphous silicon film 204 having a thickness of 300 to 1500Å, preferably 300 to 500Å, is formed on the film 203 by LPCVD or plasma CVD, dehydrogenated at 400° C. for 1 hour, and then patterned to form an island semiconductor region 204 (active layer of TFT).

In the same manner as in Example 1, a gate insulating film of SiOxNy 205 is formed. The amorphous silicon film 204 may be irradiated to laser rays or annealed under heat (preferably at a temperature not higher than 600° C.) thereby promoting its crystallization to be a crystalline silicon film (this is referred to herein as a generic name of a crystalline silicon film including, for example, microcrystalline, polycrystalline, mixed-crystalline (polysilicone) and semi-amorphous silicone films), prior to the formation of the gate insulating film on the film.

Figure 2A:
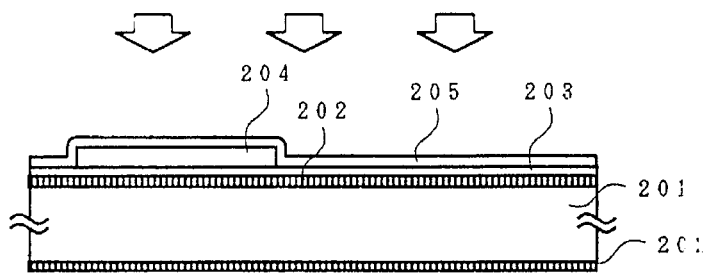
FIGS. 2A to 2E show sectional views of the TFT produced in Example 2 and explains the production steps.
Figure 2B:
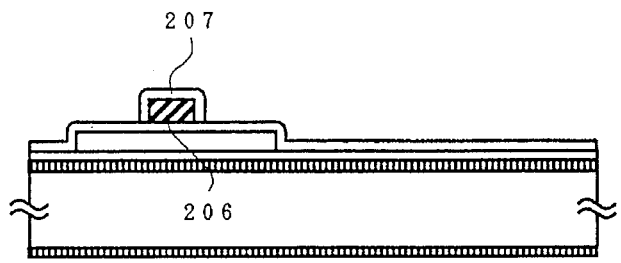

Next, in the same manner as in Example 1, an aluminum gate electrode 206 is formed, and the thus substrate is dipped in an electrolytic solution, in which an anodic oxide film 207 is formed on the surface of the aluminum wiring of the gate electrode by anodic oxidation while applying a current to the gate electrode acting as an anode. The technique for such anodic oxidation is described in our prior Japanese patent applications, Nos. 4-30220, 4-38637 and 4-54322. FIG. 2B shows the condition after this step. After the anodic oxidation, a negative voltage, for example, −100 to −200 V may be applied to this for 0.1 to 5 hours. In this step, it is desirable that the temperature of the substrate is 100° to 250° C., typically 150° C.

By this step, the mobile ions that have existed in silicon oxide or in the interface between silicon oxide and silicon are attracted by the Al gate electrode. The technique for applying such a negative voltage to the gate electrode after or during the anodic oxidation is described in our prior Japanese patent application, No. 4-115503 (filed on Apr. 7, 1992).

The oxide film 207 on the sides of the gate electrode 206 acts as a mask in the following step for ion implantation, thereby forming an offset gate structure.

Figure 2C:
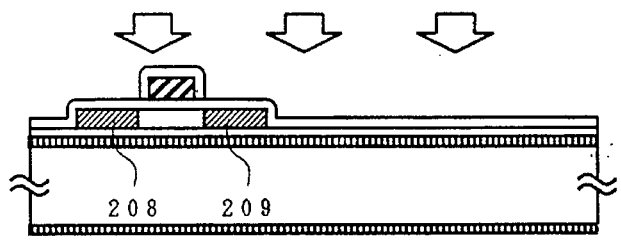
Figure 2D:
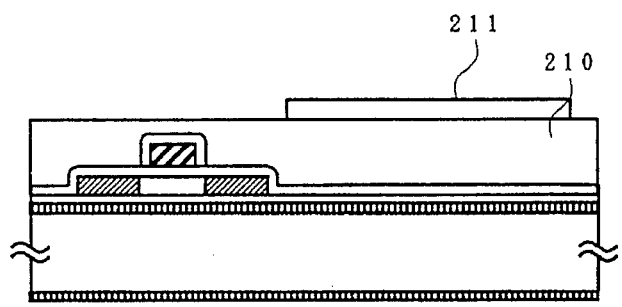
Figure 2E:
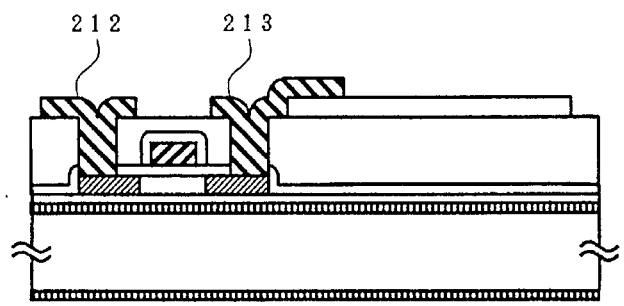
Figure 3A:
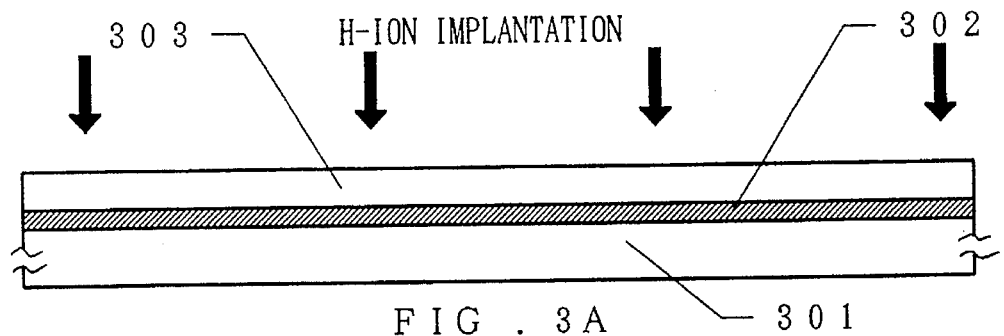
FIGS. 3A to 3D show sectional views of the TFT produced in Example 3 and explains the production steps.
Figure 3B:
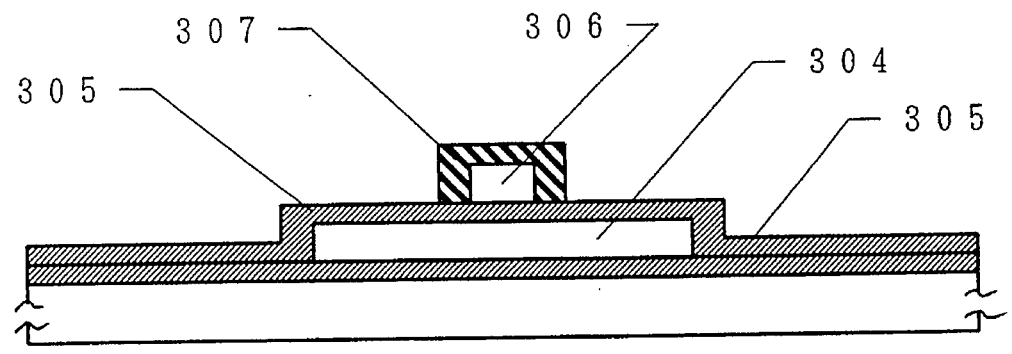
Figure 3C:
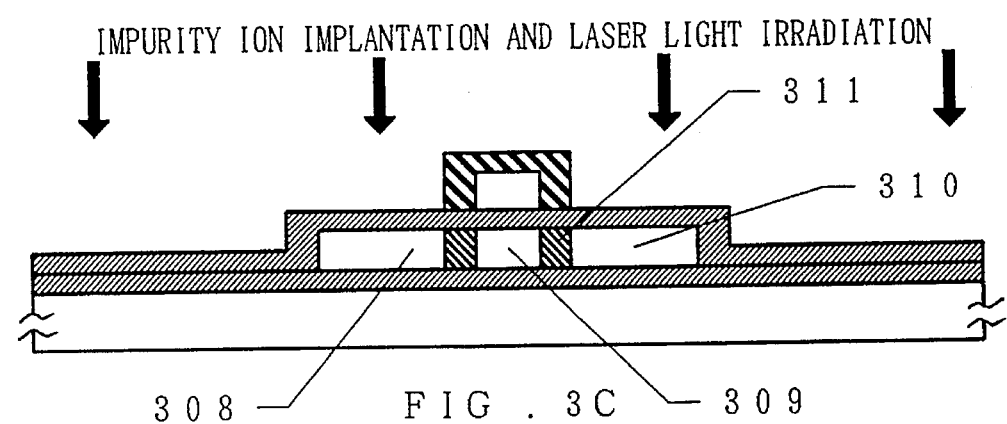
Figure 3D:
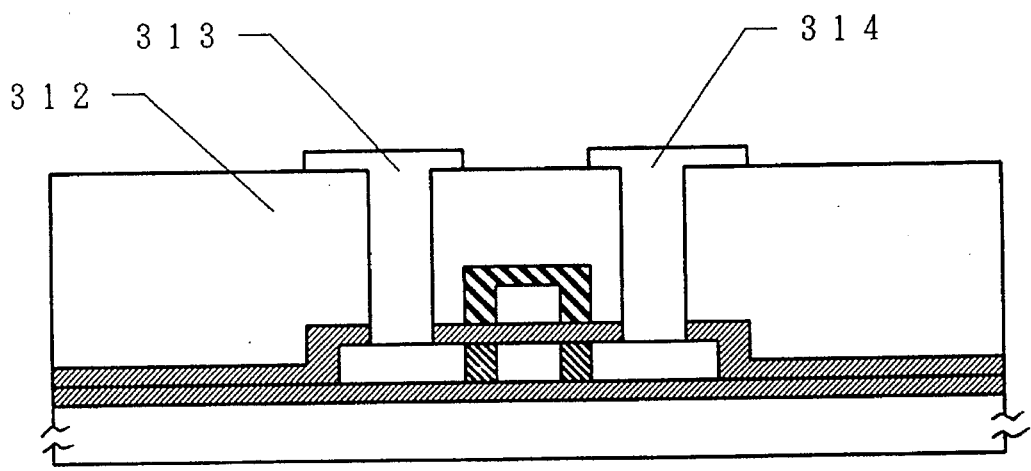

After this, boron is implanted, as a P-type impurity, into the active layer 204 by ion doping in a self-alignment, thereby forming source/drain regions 208 and 209 of TFT. Next, as shown in FIG. 2C, this is irradiated to KrF excimer laser, by which the crystallinity of the silicon film that has been deteriorated due to the ion doping is improved. The energy density of the laser is 250 to 300 mJ/cm$^2$. By the laser radiation, the sheet resistivity of the source/drain of this TFT becomes 300 to 800Ω/cm$^2$.

Due to the action of the oxide film 207, offset gate structure is realized in a self-alignment.

After this, an insulating interlayer 210 of polyimide is formed, and a pixel electrode 211 of ITO is formed. Next, contact holes are formed, and electrodes 212 and 213 of a multilayered chromium/aluminum film are formed in the source/drain regions of TFT. One electrode 213 is connected with ITO. The multilayered chromium/aluminum film is a laminate film composed of a lower chromium film having a thickness of 200 to 2000Å, typically 1000Å, and an upper aluminum film having a thickness of 1000 to 20000Å, typically 5000Å. It is desirable that the laminate film is formed by continuous sputtering.

The substrate is annealed in hydrogen at a temperatures falling between 200° and 300° C., thereby hydrogenating silicon. Finally, TFT is produced.

In an embodiment, one driving TFT (P-channel TFT) is formed for one pixel. It is also possible to conduct the above mentioned steps at plural portions on the substrate to produce an active matrix type liquid crystal display device having matrices of plural TFTs.

As another application of the present invention, there is mentioned a so-called three dimensional IC where TFTs are formed in a semiconductor integrated circuit with metal wiring. In addition to this, the present invention is also applicable to may other uses.

[EXAMPLE 3]

This example is to demonstrate a structure of gate electrodes consisting essentially of metals, in which the metal component (aluminum in this example) constituting the gate electrode is prevented from being diffused into the gate insulating film to be alloyed therein.

FIGS. 3A to 3D show the steps for producing TFT of this example. A thin SiOxNy film 302 is formed on a glass substrate 301, at a thickness of 1000Å, by plasma CVD using dichlorosilane. Next, an amorphous silicon film 303 is formed thereon at a thickness of 1000Å, by plasma CVD or by thermal CVD under reduced (low) pressure.

Nickel acetate is coated over the amorphous silicon film 303 by spin coating. This is to introduce a metal element, nickel which promotes the crystallization of silicon into the amorphous silicon film. This is heated in an inert atmosphere at 550° C. for 4 hours, whereby the amorphous silicon film 303 is crystallized to be a crystalline silicon film. The concentration of the nickel element to be in the crystalline silicone film is preferably 1×10$^{15}$ cm$^{-3}$ to 1×10$^{19}$ cm$^{-3}$. This is because, if the concentration is smaller than 1×10$^{15}$ cm$^{-3}$, the effect of nickel to promote the crystallization is insufficient, but if it is larger than 1×10$^{19}$ cm$^{-3}$, too much nickel detracts from the semiconductor characteristics of silicon in the film.

After the crystallization, hydrogen ions are implanted into the resulting crystalline silicon film. The dangling bonds of silicon in the crystalline silicon film are neutralized by the thus implanted hydrogen ions. To implant hydrogen ions into the crystalline silicon film, for example, employable are a method of directly implanting hydrogen ions into the film, a method of heating the substrate in a hydrogen atmosphere, and a method of exposing the substrate to a hydrogen plasma atmosphere. Next, this is patterned to form an active layer 304 of TFT. The above mentioned hydrogen ion implantation may be conducted after the formation of this active layer 304.

After forming the active layer 304, a thin SiOxNy film 305 is formed as the gate insulating film. This thin SiOxNy film 305 which functions as the gate insulating film is characterized in that its composition is gradually varied. In this example, the film 305 is formed in such a way that its composition is varied in the manner as shown in FIG. 4.

Figure 4:
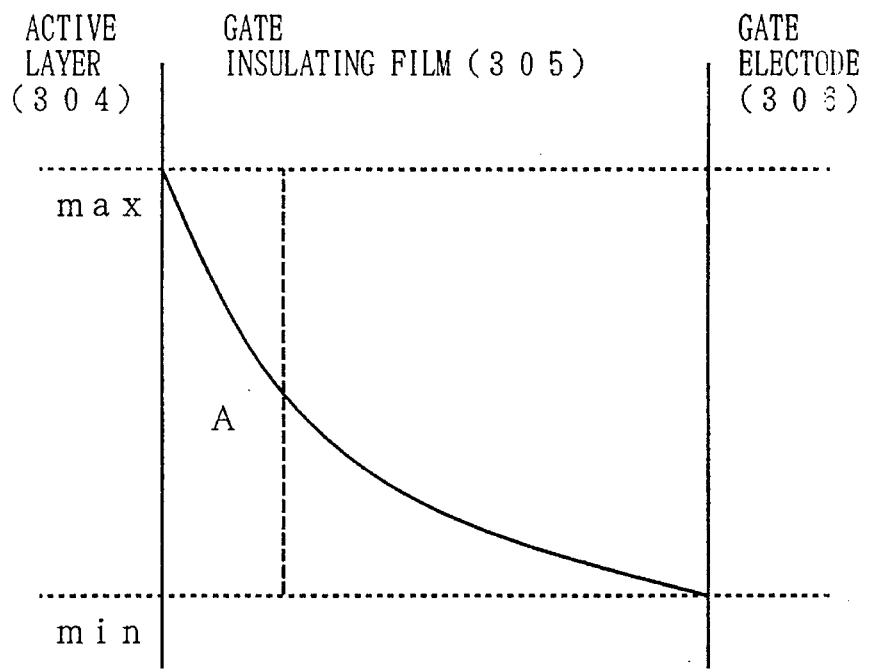
FIGS. 4 to 8 show distributions of the composition ratios of nitrogen in a gate insulating film.

In FIG. 4, the horizontal axis indicates the position of the gate insulating film sandwiched between the active layer and a gate electrode to be formed on the gate insulating film, and the vertical axis indicates the composition ratio of nitrogen (N) in the gate insulating film. In FIG. 4, "max" indicates 0.1 atomic % to 30 atomic %, and "min" indicates 0.001 atomic % to 3 atomic %. These values mean the composition ratios of nitrogen atom in the gate insulating film. To obtain the composition ratios having the distribution shown in FIG. 4, for example, SiH$_4$, O$_2$ and NH$_3$ are used as a mixed raw material gas where the mixing ratio of NH$_3$ is controlled. Concretely, the mixing ratio of NH$_3$ in the raw material gas mixture to be used is gradually lowered with the proceeding of the formation of the gate insulating film of SiOxNy from the start of its formation, whereby the distribution of the composition ratios of nitrogen such as that shown in FIG. 4 is obtained. As the raw material gas, also usable are a high order silane gas such as Si$_2$H$_6$, and even N$_2$O gas, etc.

In the gate insulating film having the distribution of the composition ratios of nitrogen such as that shown in FIG. 4, the nitrogen content in the interface between the active layer and the gate insulating layer and also in the vicinity of the interface is larger than the other area of the gate insulating film. The bonding between silicon and nitrogen is tight and has a high barrier effect. The area (A) in FIG. 4 acts as a barrier to prevent hydrogen ions and nickel ions existing in the active layer from invading the gate insulating film. Since the area other than (A) has a lowered composition ratios of nitrogen, it is possible to decrease the charge capture centers to be caused by Si clusters, which are problematic in silicon nitride film, in the area other than (A). The gate insulating film has, as a whole, the significant characteristics peculiar to SiOxNy. Accordingly, the structure of this example has the significant characteristics peculiar to SiOxNy and the additional significant characteristic of preventing various ions existing in the active layer from invading the gate insulating film.

After forming the gate insulating film 305 in the manner as mentioned above, a thin film consisting essentially of aluminum is formed on the film 305, at a thickness of 5000Å. The thin film consisting essentially of aluminum is then patterned to form a gate electrode 306. After the formation of the gate electrode 306, the substrate is dipped in an electrolytic solution and anodized, while using the gate electrode as an anode, to thereby form an oxide layer 307 on the whole surface of the gate electrode 306. The thickness of the oxide layer 307 is 2000Å. Due to the existence of this oxide layer 307, an offset gate region can be formed in the following step for implanting impurity ions into the active layer.

Impurity ions are implanted into the active layer to form a source region 308, a drain region 310 and a channel forming region 309 in a self-alignment. At the same time, an offset gate region 311 is formed. In this example, P (phosphorus) ions are implanted to form an N-channel TFT. After implanting the impurity ions, laser or intense light is irradiated to the layers, by which the source region 308 and the drain region 310 are activated. This step may be conducted under heat at from 400° to 700° C. (See FIG. 3C.)

An insulating interlayer 312 of silicon oxide is formed by plasma CVD. Contact holes are formed through the interlayer 312, and thereafter a source electrode 313 and a drain electrode 314 are formed. After these steps, TFT is finally obtained. In the structure of TFT shown in FIG. 3, since the active layer is entirely covered with the thin film of SiOxNy, hydrogen and metal elements which exist in the active layer and which promote crystallization are prevented from being diffused outside.

The structure illustrated by this example can be used also as the gate insulating film in the thin film transistors of Examples 1 and 2.

[EXAMPLE 4]

Figure 5:
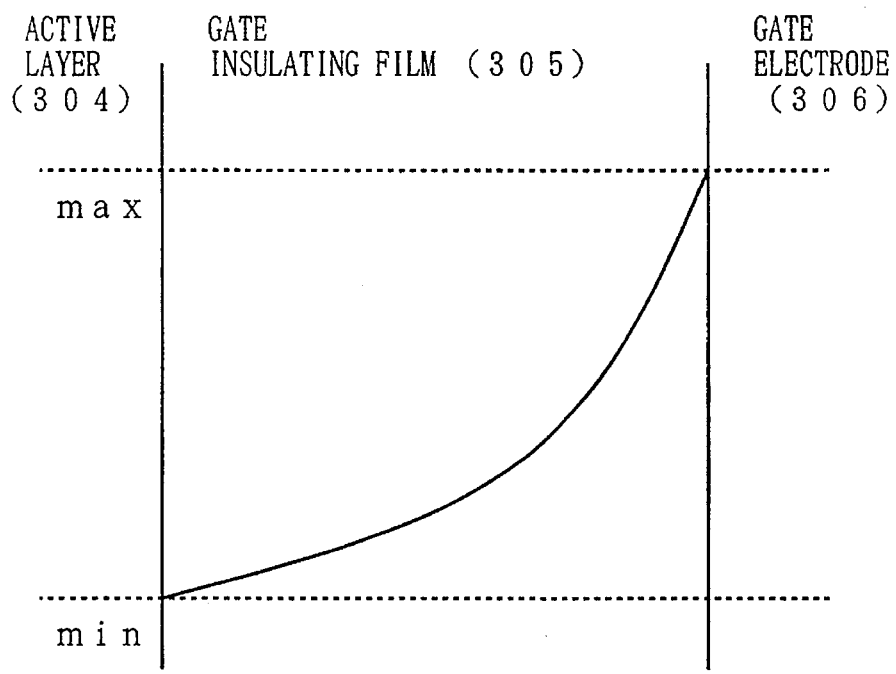

This example is the same as Example 3, except that the gate insulating film 305 has a distribution of the composition ratios of nitrogen such as that shown in FIG. 5. FIG. 5 shows the distribution of the composition ratios of nitrogen (N) in the gate insulating film 305 of SiOxNy. The structure of the gate insulating film 305 of this example is characterized in that the composition ratios of nitrogen in the film 305 are made gradually larger from the side of the film 305 facing the active layer 304 to the side of the film 305 facing the gate electrode 306.

In FIG. 5, "max" indicates 0.1 atomic % to 30 atomic %, preferably 1 atomic % to 30 atomic %, and "min" indicates 0.001 atomic % to 3 atomic %. These values can be controlled by varying the mixing ratio of the nitrogen containing gas (for example $NH_4$) to the mixed raw material gas to be used. To gradually vary the composition ratios of nitrogen atom as in FIG. 5, the mixing ratio of the nitrogen containing gas to the mixed raw material gas being used is gradually varied during the formation of the gate insulating film 305.

Where the structure shown in FIG. 5 is employed, since a barrier layer can be formed in the side of the gate insulating film 305 facing the gate electrode 306, it is possible to prevent the components existing in the gate electrode from being diffused into the gate insulating film. For example, it is possible to prevent aluminum which constitutes the gate electrode from being diffused into the gate insulating film to be alloyed with silicon atom in the gate insulating film.

In particular, when the activation of the source/drain regions is intended to be conducted under heat, the structure of this example is effectively employed. Concretely, when the gate electrode is made of a metal having a low melting point such as aluminum and when the activation of the source/drain regions is conducted generally at a temperature falling between 400° C. and 700° C. or so, aluminum constituting the gate electrode is diffused into the gate insulating film to be alloyed with silicon existing in the gate insulating film. However, if the structure shown in FIG. 5 is employed in such case, the diffusion of aluminum from the gate electrode into the gate insulating film can be prevented.

[EXAMPLE 5]

Figure 6:
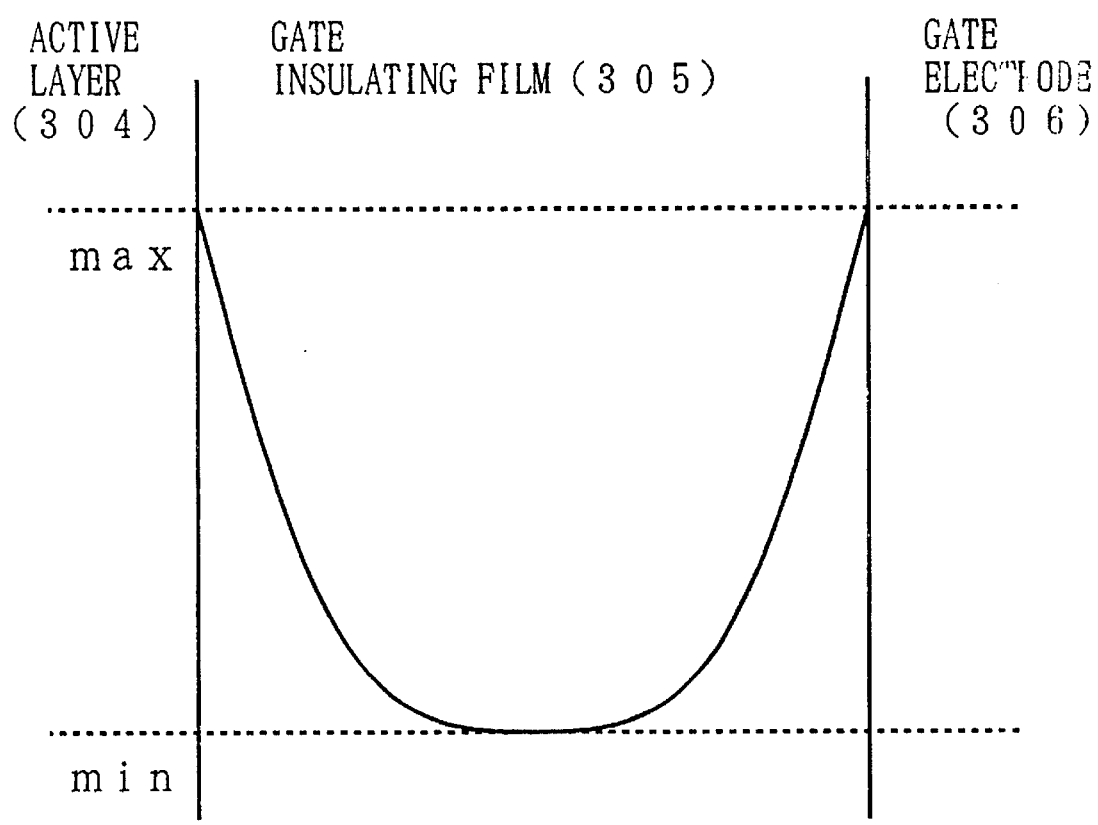

This example is the same as Example 3, except that the gate insulating film 305 has a distribution of the composition ratios of nitrogen such as that shown in FIG. 6. FIG. 6 shows the distribution of the composition ratios of nitrogen (N) in the gate insulating film 305 of SiOxNy. The structure of the gate insulating film 305 of this example is characterized in that the composition ratios of nitrogen in the film 305 are made varied in a U-curved manner from the side of the film 305 facing the active layer 304 to the side of the film 305 facing the gate electrode 306, as in FIG. 6.

In FIG. 6, "max" indicates 3 atomic % to 30 atomic %, preferably 1 atomic % to 30 atomic %, and "min" indicates 0.01 atomic % to 3 atomic %. These values can be controlled by varying the mixing ratio of the nitrogen containing gas (for example $NH_4$) to the mixed raw material gas to be used. In order to gradually vary the composition ratios of nitrogen atom in such a U-curved manner as in FIG. 6, the mixing ratio of the nitrogen containing gas to the mixed raw material gas being used is gradually varied during the formation of the gate insulating film 305.

Where the structure of FIG. 6 is employed, a barrier layer in the gate insulating film 305 can be formed in the interface between the film 305 and the gate electrode 306 and also in the interface between the film 305 and the active layer 304. Therefore, it is possible to prevent the components existing in the gate electrode from being diffused into the gate insulating film and also to prevent hydrogen ions and crystallization promoting metal elements (for example, Ni) existing in the active layer from being diffused into the gate insulating film.

Therefore, using the structure of FIG. 6, it is possible to improve the electric stability of the gate insulating film and to thereby improve the characteristics of TFT.

[EXAMPLE 6]

The structure of FIG. 6 is one embodiment of the gate insulating film 305 of TFT shown in FIGS. 3A to 3D, in which the composition ratios of nitrogen (N) in the film 305 are gradually varied in a U-curved manner from the side of the film 305 facing the active layer 304 to the side of the film 305 facing the gate electrode 306. In this structure, the variation in the composition ratios of nitrogen in the film 305 gives a U-curve, which is smoothly sloping or is seemingly smoothly sloping or is in such a shape that is similar to a smoothly sloping U-curve. However, even though the composition ratios of nitrogen in the film 305 are not varied gradually, but are varied stepwise, the same effect as that of the structure of FIG. 6 can be attained.

Figure 7:
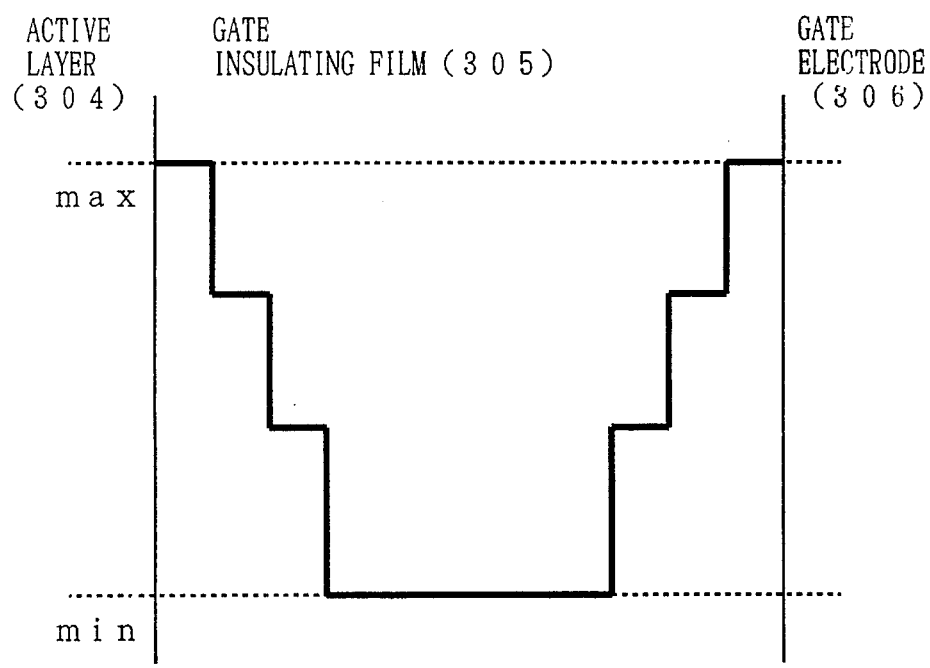

FIG. 7 shows one embodiment of the structure of a thin gate insulating film 305 of SiOxNy where the composition ratios of nitrogen are stepwise varied. In the gate insulating film 305 having the structure of FIG. 7, the concentrations of nitrogen (composition ratios of nitrogen) are stepwise (in three steps in this example) decreased from its side facing the active layer, while being stepwise (in three steps in this example) increased toward the gate electrode. In FIG. 7, "max" indicates 3 atomic % to 30 atomic %, and "min" indicates 0.01 atomic % to 3 atomic %.

To obtain the structure of FIG. 7, the gate insulating film is formed in plural times corresponding to the necessary steps for the change in the composition ratios of nitrogen, while the mixing ratio of the nitrogen containing gas to the raw material gas mixture is changed at every step.

When a gate insulating film having the structure shown in FIG. 7 is employed, its dielectric constant is varied discontinuously at the part where the composition ratios of nitrogen are varied stepwise. Therefore, the film of this structure involves a problem in that the capacitors are to be such that these are connected equivalently in series. In other words, since the capacitors are to be such that these are connected equivalently in series, the gate insulating film itself after all has a problem in that it is charged. (In view of this problem, it is more preferred that the composition ratios of nitrogen in the gate insulating film are continuously varied, as in FIG. 6, rather than they are stepwise varied, as in FIG. 7.)

[EXAMPLE 7]

Figure 8:
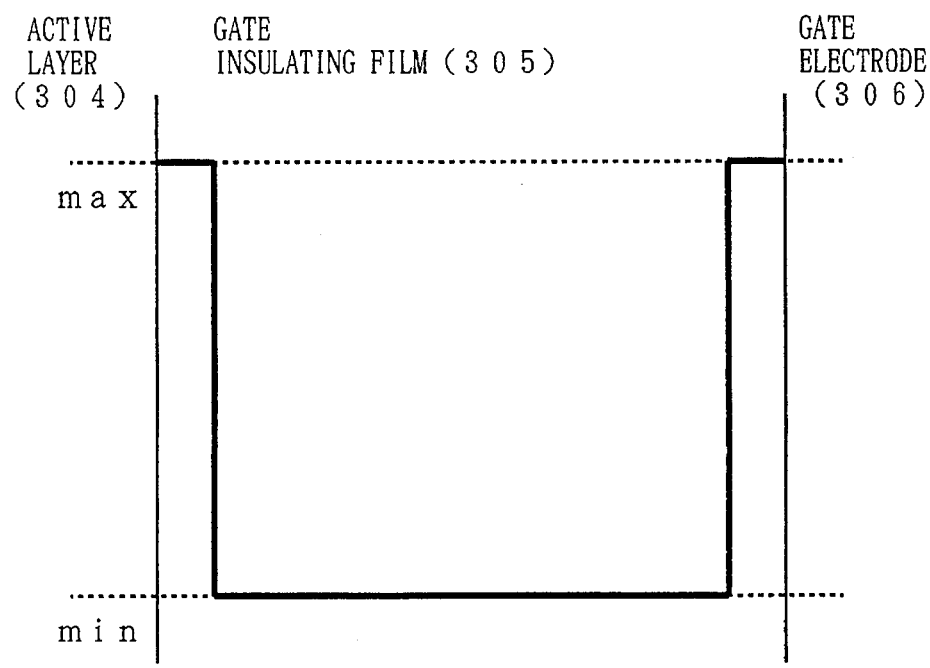

In this example, the gate insulating film of SiOxNy has a structure as in FIG. 8, which is modified from the structure of FIG. 7. Concretely, the gate insulating film of this example is characterized in that the composition ratios of nitrogen in the film are varied as in FIG. 8. In FIG. 8, "max" indicates 3 atomic % to 30 atomic %, and "min" indicates 0.01 atomic % to 3 atomic %.

[EXAMPLE 8]

FIGS. 9A to 9F show the production steps of this example. A base silicon oxide film 402 having a thickness of 2000Å is formed on a glass substrate 401. Subsequently, an amorphous silicon film 403 is deposited thereon at a thickness of 500Å by plasma CVD. Next, a thin nickel acetate film is formed on the surface of the amorphous silicon film by spin coating. The substrate is annealed under heat at 550° C. for 4 hours, whereby the amorphous silicon film is crystallized. To further augment the crystallization, this is subjected to photo-annealing after the thermal annealing. (See FIG. 9A.)

The silicon film 403 is patterned to form island regions 404 and 405. This is subjected to photo-annealing in an oxygen/nitrogen atmosphere containing 10 to 90% of oxygen, whereby a silicon oxide film 406 having a thickness of approximately 10 to 100Å is formed on the surfaces of the island regions 404 and 405. In this example, KrF excimer laser (having a wavelength of 248 nm) is used. However, any other lasers or equivalent rays may also be used. The energy density of the laser is suitably 200 to 350 mJ/cm$^2$. Since the optimum energy density of the laser varies, depending on the degree of crystallinity, the thickness, the surface condition, etc. of the silicon film, it may be adjusted in accordance with these conditions of the silicon film. In this laser radiation step, the amorphous region still remained in the crystalline silicon film is crystallized and the crystallinity of the silicon film is improved. The silicon oxide film 406 is similar to a silicon oxide film to be obtained by thermal oxidation and is dense, tight and uniform. Further, since the interface between the silicon oxide film and the silicon film is in an ideal condition, a gate insulating film having excellent characteristics and high reliability can be formed on the silicon oxide film in the following step. (See FIG. 9B.)

A gate insulating film 407 of SiOxNy is formed to cover these island regions 404 and 405, at a thickness of 200 to 1500Å, in the same manner as in Example 1.

Figure 11:
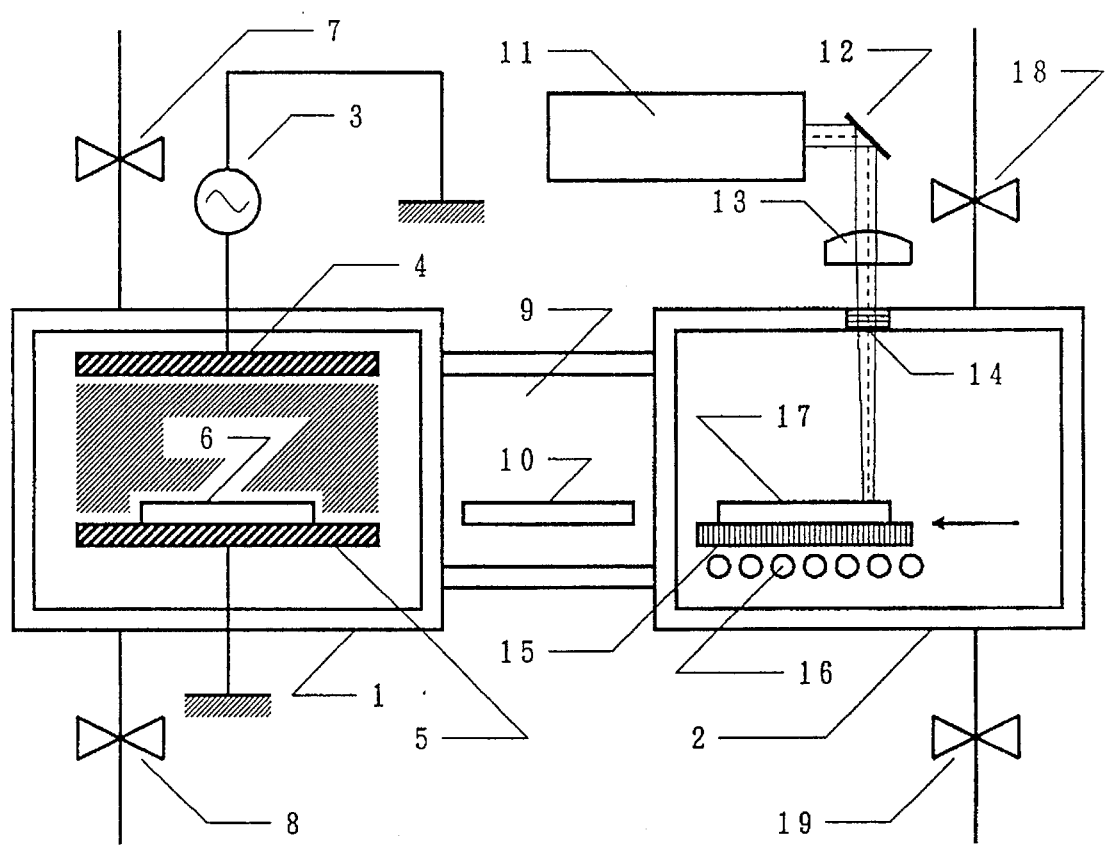
FIG. 11 shows the laser annealing apparatus and the filming apparatus used in the examples.

The above steps for photo-annealing oxidation by laser radiation and for forming the gate insulating film are conducted, using an apparatus shown in FIG. 11. FIG. 11 shows a conceptual view of the apparatus for these steps, which is composed of a plasma CVD film formation unit and a laser processing unit (for example, laser annealing unit) combined together via one spare room therebetween.

In FIG. 11, numeral 1 is a chamber of the plasma CVD unit, and numeral 2 is a chamber of the laser annealing unit. These chambers are provided with gas introducing valves 7 and 18 and exhaust valves 8 and 19, respectively, through which the necessary gas is introduced into the chambers and the exhaust gas is discharged therefrom. Via these valves, the pressure in the inside of each chamber is maintained at a suitable value.

The chamber 1 is provided with electrodes 4 and 5, the substrate (sample) 6 to be treated is put on the electrode 5, and the electrode 4 is connected with an RF power 3 (for example, having a frequency of 13.56 MHz). A suitable gas mixture (for example, comprising monosilane or disilane, and oxygen, nitrogen suboxide, etc.) is introduced into the chamber 1, while the electrodes are discharged. In this way, a film is formed on the substrate 6. The substrate 6 may optionally be heated.

The chamber 2 is provided with a window 14, and laser rays emitted by the laser unit 11 and passed through the lens 13 via the mirror 12 are applied to the substrate 17 put on the sample holder 15 through the window 14. The substrate is heated by the heater 16 at 200° to 500° C., preferably at 300° to 400° C. To conduct the photo-annealing with good reproducibility, this heating is effective.

In the chamber 2, the surface of the active layer is photo-oxidized by laser annealing, by which the crystallinity of the active layer is improved at the same time and the characteristics of the annealed active layer are improved. In this process, the chamber of the laser annealing unit is made to have an oxygen atmosphere, and the crystallinity of the monocrystalline silicon film is improved while, at the same time, an oxide film is formed on the surface of the film. If the laser annealing is conducted in a nitriding atmosphere such as an ammonia atmosphere or the like, a nitride film is formed on the surface of the silicon film. If it is conducted in a nitrogen suboxide atmosphere or in a mixed atmosphere comprising oxygen and ammonia, a nitridoxide film is formed.

The sample holder is movable and can be moved gradually toward the left side of the drawing while it carries the substrate thereon. As a result, the whole surface of the substrate can be subjected to laser annealing. For example, when the size of the substrate is 300 mm×400 mm, linear laser beams having a size of 2 mm×350 mm are applied thereto and the whole surface of the substrate can be treated by the laser beams. When the moving speed of the holder is 20 mm/sec, the time needed for treating one substrate is 400/20=20 seconds.

The substrate having thereon crystalline silicon islands is processed according to the steps mentioned below. First, the spare room is degassed to have an internal pressure of $10^{-5}$ to 1 Torr. On the other hand, the chamber 2 of the laser processing unit is also degassed to the same degree as in the spare room. The gate between the spare room and the laser processing unit is opened, and the substrate is transported from the spare room to the laser processing unit. After the substrate has been transported, the gate is shut, and gas is introduced into the chamber 2 under suitable pressure. Then, the sample holder 15 is heated up to a suitable temperature by the heater 16. After the temperature of the sample holder 15 has been stabilized and the position of the substrate set in the laser processing unit has been accurately ordered, the substrate is subjected to laser treatment. By the laser radiation, the crystallinity of the silicon film on the substrate is improved. During this process, the atmosphere in the chamber 2 is controlled to have 1 to 1000 Torr and have a partial pressure of oxygen or nitrogen oxide (for example, nitrogen suboxide ($N_2O$), nitrogen dioxide ($NO_2$), etc.) of 10% or more. By this laser radiation, a thin silicon oxide film is formed on the surface of the silicon film.

The chamber 2 is degassed to have a pressure of $10^{-5}$ to 1 torr, and the substrate is again returned back to the spare room 9 and thereafter transported to the plasma CVD filming chamber 1 that has been degassed to the same degree as in the spare room. In this chamber 1, an insulating film of silicon oxide, silicon nitride or the like is formed according to the predetermined filming process. During this filming process conducted in the chamber 1, a different substrate may be processed in the chamber 2. After the filming has been finished, the filming chamber 1 is degassed to have a pressure of $10^{-5}$ to 1 Torr, then the gate between the filming chamber 1 and the spare room is opened, and the substrate is transported to the spare room that has been degassed to the same degree as in the chamber 1. After this, the pressure in the spare room is restored to atmospheric pressure, and the substrate is taken out in air.

In the above process, if the processing time for one substrate in the laser processing unit including the time for setting the substrate, the time for ordering the position of the substrate and the time for taking out the substrate from the chamber is almost equal to the filming time for the same substrate in the plasma CVD unit including the time for setting the substrate and the time for degassing the chamber, one substrate can be processed continuously in the laser processing unit and then in the plasma CVD chamber with needing no waiting time. If the laser processing time for one substrate is a half of the filming time for the same by plasma CVD, two substrates may be processed by plasma CVD at the same time. In this case, two substrates are first stocked in the spare room, one of these is transported to the laser processing chamber and is processed therein while the other is still stocked in the spare room. After the first one has been processed, the other that has still been stocked in the spare room is transported to the laser processing chamber and is processed therein. In this way, after these two substrates have been processed with laser rays, these are transported into the plasma CVD chamber and are processed by plasma CVD at the same time in this chamber.

Figure 9A:
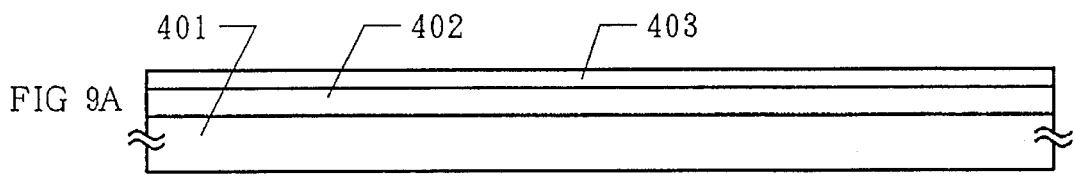
FIGS. 9A to 9F show sectional views of the TFT produced in Examples 8 and 9 and explains the production steps.
Figure 9B:
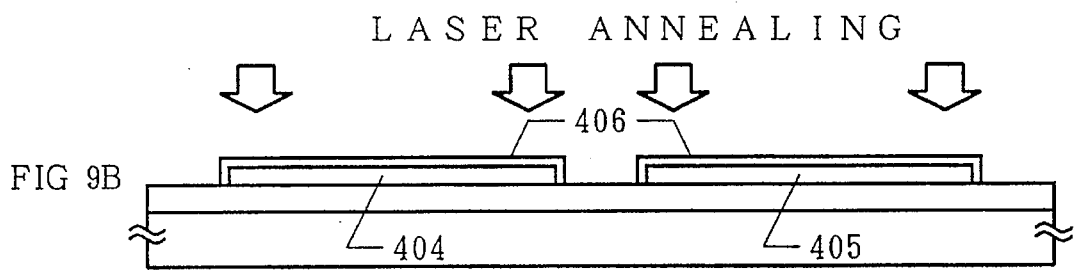
Figure 9C:
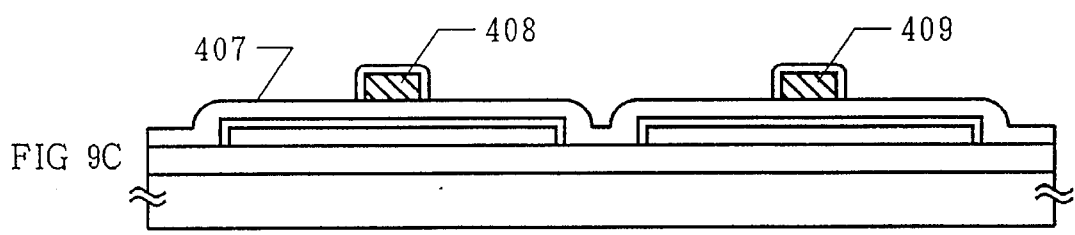
Figure 9D:
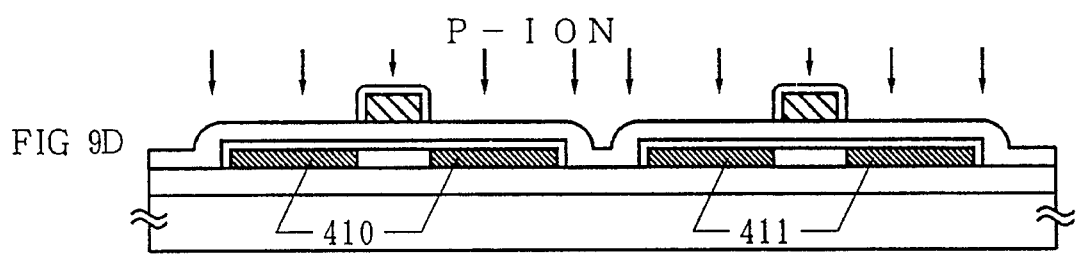
Figure 9E:
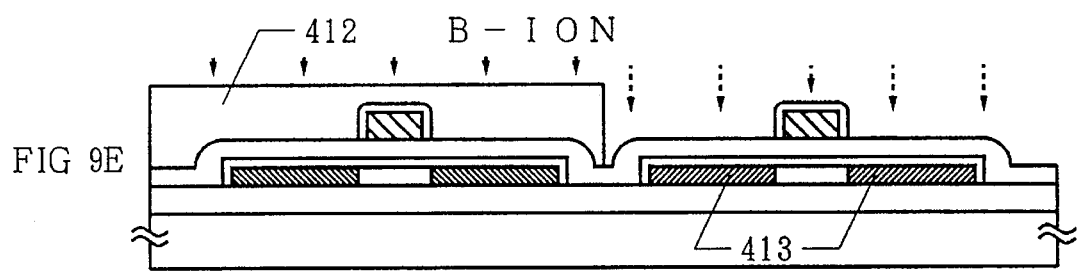
Figure 9F:
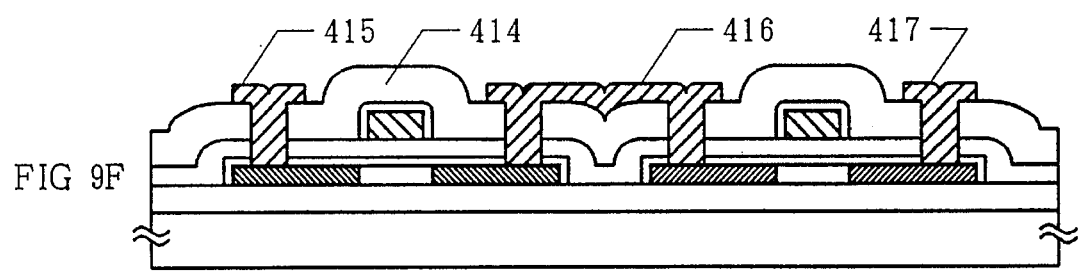

After the substrate is photo-oxidized by laser annealing and then coated with a gate insulating film according to the process mentioned above, an aluminum film having a thickness of 2000Å to 5 μm is formed thereon by electron beam deposition and this is patterned to form gate electrodes 408 and 409, as shown in FIG. 9C. These gate electrodes are thereafter subjected to anodic oxidation, by which an anodic oxide film having a thickness of 1500Å to 2000Å is formed on the top surface and the side surface of each gate electrode. The conditions for the anodic oxidation are the same as those in Example 2. (See FIG. 9C.)

After this, mono-conductive impurities are implanted into the island regions 404 and 405 in each TFT by ion doping in a self-alignment, using the gate electrodes as masks. To conduct the implantation, phosphorus is first implanted into the whole surface, using phosphine ($PH_3$) as a doping gas, to form N-type impurity regions 410 and 411. (See FIG. 9D.)

Only the island region 404 is coated with a photoresist 412 and boron is implanted into only the impurity region 411 using diborane ($B_2H_6$) as a doping gas. In this process, the N-type impurity region 411 is reversed to be a P-type impurity region 413. (See FIG. 9E.)

The dose of phosphorus is $2 \times 10^{15}$ to $8 \times 10^{15}$ $cm^{-2}$, and that of boron is $4 \times 10^{15}$ to $10 \times 10^{15}$ $cm^{-2}$. It is desirable that the dose of boron is higher than that of phosphorus.

A KrF excimer laser is irradiated to the substrate, by which the crystallinity of the parts deteriorated due to the implantation of the above mentioned impurity regions 410 and 413 thereinto is improved and the impurities implanted are activated. It is desirable that the energy density of the laser is 200 to 400 $mJ/cm^2$, preferably 250 to 300 $mJ/cm^2$. To further augment this effect, the thus substrate may be subjected to thermal annealing at 350° C. to 550° C. after the previous laser annealing. Since the gate electrodes have been covered with the anodic oxide film, these are not deformed at all even by such thermal annealing. As a result, the N-type impurity region and the P-type impurity region are formed. The sheet resistivity of these regions is 200 to 800$\Omega/cm^2$.

An interlayer insulating film 414 of silicon oxide having a thickness of 3000Å is formed on the whole surface. Next, contact holes are formed at the source/drain of TFT, and source/drain electrodes 415, 416 and 417 are formed. (See FIG. 9F.)

According to the above mentioned process, a CMOS type TFT is formed.

[EXAMPLE 9]

This example is to demonstrate the formation of a CMOS type TFT, using the gate insulating film of Example 5. FIG. 9 shows the structure of the TFT of this example.

A base oxide film 402 of SiOxNy is formed on a substrate 401 at a thickness of 1000Å by plasma CVD. Next, an amorphous silicon film is formed thereon at a thickness of 500Å also by plasma CVD. This is annealed under heat, using nickel acetate in the same manner as in Example 8, by which the silicon film is crystallized. (See FIG. 9A.)

The silicon film 403 to be an active layer is patterned to form island regions 404 and 405. After this, this is subjected to laser annealing in an $N_2O$ atmosphere, by which a silicon oxide film 406 having a thickness of approximately 10 to 100Å is formed on the surfaces of the island regions 404 and 405. In this example, a KrF excimer laser (having a wavelength of 248 nm) is used. By this laser radiation, the amorphous region still remained in the above crystalline silicon film is crystallized, and the crystallinity of the silicon film is improved. (See FIG. 9B.)

After these island regions 404 and 405 have been formed, a thin gate insulating film 407 of SiOxNy is formed thereover. In this example, the gate insulating film 407 has a distribution of the composition ratios of nitrogen such as that shown in FIG. 6, as in Example 5. As in FIG. 6 which shows the distribution of the composition ratios of nitrogen (N) in the gate insulating film 407 of SiOxNy, the structure of the gate insulating film 407 of this example is characterized in that the composition ratios of nitrogen in the film 407 are made varied in a U-curved manner from the side of the island regions 404 and 405 to the side of the gate electrodes 408 and 409, respectively.

Figure 12:
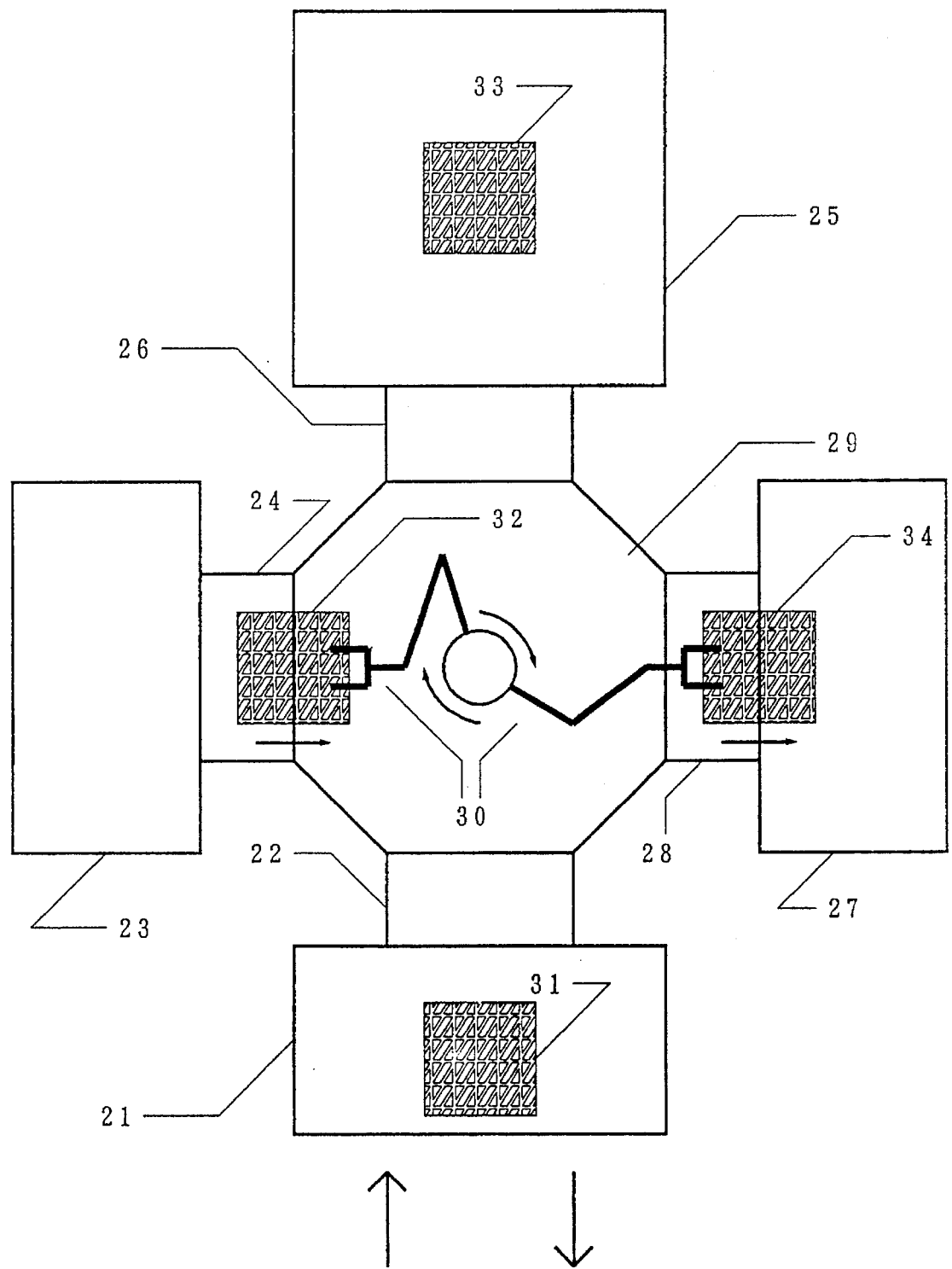
FIG. 12 shows a systematic view of the apparatus used in the examples.

In this example, a multi-chamber apparatus such as that shown by FIG. 12 is employed. The apparatus of FIG. 11 is a multi-chamber apparatus composed of two units connected in series. Different from this, the apparatus used in this example is a planet type multi-chamber apparatus. Concretely, this planet type multi-chamber apparatus is composed of a chamber 21, into which a substrate to be processed is put and from which the substrate processed is taken out, a heating chamber 23 where a substrate is subjected to various heat treatments (for example, annealing in a hydrogen atmosphere), a laser processing chamber 25 where a substrate is irradiated to laser rays, a filming chamber 27 where a silicon nitridoxide film is formed on a substrate by plasma CVD, and a spare room 29 which is common to these chambers. The spare room is connected to each chamber via gates 22, 24, 26 and 28. The substrate to be processed is moved between these chambers by a robot hand 30 that has been disposed in the common spare room 29, such as that shown by 31 to 34. To move the substrate to be processed between the chambers, for example, a so-called C-to-C (cassette to cassette) system may be employed, in which plural substrates to be processed are set in a cassette in the chamber 21 and are automatically moved to the intended chamber one by one by the robot hand and the processed substrates are automatically reset in the cassette.

According to the process of this example, the substrate is first subjected to laser annealing in the chamber 25, and thereafter this is transported to the filming chamber 27 where the gate insulating film is formed. Using the apparatus such as that shown by FIG. 12, the gate insulating film can be formed on the silicon film that has been processed by laser annealing without exposing the silicon film to air (atmosphere).

After the above steps, an aluminum film having a thickness of 5000Å is formed as gate electrodes 408 and 409 and then an anodic oxide film is coated on the top surface and the side surface of each gate electrode. (See FIG. 9C.)

N-type impurity regions 410 and 411 are formed in the island regions 404 and 405, respectively, in each TFT. (See FIG. 9D.)

Next, only the island region 404 is coated with a photoresist 412, and a P-type impurity is implanted into the island region 405 to form a P-type impurity region 413 therein. (See FIG. 9E.)

The substrate is subjected to thermal annealing at 500° C. for 20 minutes, by which the doped impurity is activated. This is irradiated with KrF excimer laser (having a wavelength of 248 nm and a pulse width of 20 nsec), by which the activation of the doped impurity is further performed. This is subjected to thermal annealing at 500° C. for 20 minutes, by which the trap levels formed at the source/channel bond and at the drain/channel bond are removed.

An insulating interlayer 414 of silicon oxide is formed on the whole surface of the substrate, at a thickness of 3000Å. The process from the above mentioned laser annealing step to the step of forming the insulating interlayer may be conducted in the apparatus shown by FIG. 12. Concretely, the substrate is first subjected to thermal annealing in the heating chamber 23, and then this is transported to the laser processing chamber 25 where this is subjected to laser annealing. Afterwards, this is again transported to the heating chamber 23, where this is subjected to thermal annealing, and thereafter this is transported to the filming chamber 27 where the insulating interlayer is formed on the substrate.

In the above steps, the laser annealing speed and the filming speed may be almost the same, but the thermal annealing step requires longer time by about 10 times than the laser annealing or filming step. Therefore, ten substrates are subjected to thermal annealing all at a time. Accordingly, the spare room 29 shall be so constructed that it can stock ten or more laser annealed substrates therein.

After the insulating interlayer is formed by the above process, contact holes are formed through the source/drain regions in each TFT and source/drain electrodes 415, 416 and 417 are formed. (See FIG. 9F.)

According to the above mentioned process, a CMOS type TFT is formed.

[EXAMPLE 10]

In this example, a substrate is subjected to laser annealing in an oxidizing atmosphere containing fluorine or chlorine, before the step of forming thereon a gate insulating film such as that in Example 6. By this laser annealing, the impurities in the crystalline silicon film formed on the substrate are removed.

A base oxide film 502 of SiOyNy is formed on a substrate 501 at a thickness of 1400Å by plasma CVD. Next, an amorphous silicon film 503 is formed thereon at a thickness of 500Å also by plasma CVD, and this is crystallized. (See FIG. 10A.)

The silicon film 503 is etched to form an island region 504. The substrate is irradiated to KrF excimer laser (having a wavelength of 248 nm) in an oxygen atmosphere containing 30% of hydrogen chloride. The density of the radiation energy is 250 to 450 mJ/cm$^2$, for example, 300 mJ/cm$^2$, and 10 to 50 shots/site of the laser radiation are applied to the substrate. It is desirable that the temperature of the substrate is 200° to 500° C. By this laser radiation, nickel existing on the surface of the island region 504 is compounded with chlorine to be vaporized or selectively captured by the silicon oxide film 505.

The silicon oxide film 505 formed has a composition containing chlorine, and its thickness is approximately 10 to 50Å, though depending on the energy density of the laser applied and even the number of shots of the laser applied. In this step, carbon tetrachloride, nitrogen trifluoride, dicarbon hexafluoride or the like may be used in place of hydrogen chloride. In this step, chlorine is introduced even into the active layer. (See FIG. 10B.)

A gate insulating layer may be formed on the film 505. In this example, however, the thus substrate is dipped in an etchant comprising hydrofluoric acid or the like, by which the silicon oxide film 505 is etched, prior to the formation of a gate insulating layer. By this etching treatment, the silicon oxide film 505 is etched while the impurity nickel is removed at the same time, and the nickel content in the active layer 504 becomes extremely reduced.

A thin gate insulating film 506 of SiOxNy is formed on the active layer 504. In this example, the gate insulating film 506 has a distribution of the composition ratios of nitrogen, such as that shown by FIG. 7, like in Example 6. In order to obtain the structure of FIG. 7, the gate insulating film is formed in plural times corresponding to the necessary steps for the change in the composition ratios of nitrogen, while the mixing ratio of the nitrogen containing gas to the raw material gas mixture being used is changed at every step.

An aluminum film having a thickness of 5000Å is coated on the film 506 to form a gate electrode 507 thereon. (See FIG. 10C.)

An impurity is implanted into the island region 504 in a self-alignment by ion doping, while using the gate electrode portion as a mask. In this step, phosphorus is implanted into the island region 504, using phosphine (PH$_3$) as a doping gas, to thereby form an N-type impurity region 508 in the region 504. The dose of phosphorus is $1\times10^{14}$ to $5\times10^{17}$ cm$^{-2}$ and the accelerated voltage applied is 60 to 90 kV, for example, the former is $1\times10^{15}$ cm$^{-2}$ and the latter is 80 kV. (See FIG. 10D.)

Next, KrF excimer laser (having a wavelength of 248 nm and a pulse width of 20 nsec) is irradiated to the thus substrate, by which the crystallinity of the parts deteriorated due to the implantation of the impurity region 508 thereinto is improved and the impurity implanted is activated. The energy density of the laser used herein is 200 to 400 mJ/cm$^2$, preferably 250 to 300 mJ/cm$^2$.

An insulating interlayer film 509 of silicon oxide is formed on the whole surface of the substrate at a thickness of 3000Å. The insulating interlayer film 509 and the gate insulating film 506 are etched to form a contact hole for a source. An aluminum film is formed to cover the contact hole, and this is etched to form a source electrode 510. (See FIG. 10E.)

A passivation film 511 of silicon nitride is formed at a thickness of 3000Å. The passivation film 511, the insulating interlayer film 509 and the gate insulating film 506 are etched to form a contact hole for a drain. An indium tin oxide film (ITO film) is formed by sputtering, and this is etched to form a pixel electrode 512. (See FIG. 10F.)

According to the process mentioned above, a pixel transistor for active matrix circuits is formed.

TFT of the present invention, having a gate insulating film of SiOxNy formed on an insulating substrate, especially on a glass substrate, is advantageous in that;

the electrostatic breakdown of the gate electrode is prevented; the SiN bonds prevent Na and heavy metal ions from being drifted; and since the film has no fixed charge therein, the C-V (capacitance-voltage) characteristic of TFT does not yield hysteresis and stable motion of TFT is expected.

If chlorosilane or dichlorosilane is used as the raw material gas when the SiOxNy film is formed, Cl (chlorine) can be added to the film. Due to the action of Cl introduced in the film, the impurity ions can be fixed. Therefore, in addition to the above mentioned advantages, TFT having the gate insulating SiOxNy film is further advantageous in that its motion is always stable.

In addition, in the semiconductor device of the present invention having a gate insulating film of SiOxNy, the composition ratio of N in the SiOxNy film is made the largest in the interface(s) between the film and the adjacent active layer and/or between the film and the adjacent gate electrode. Therefore, since the gate insulating film of SiOxNy has such a particular composition structure, various ions and elements are not diffused from the active layer and/or the gate electrode to the gate insulating film.

What is claimed is:

1. A method for producing a semiconductor device comprising the steps of:

forming an active layer on a substrate having an insulating surface;

irradiating a laser into the active layer in an atmosphere including at least one of oxygen, nitrogen and halogen element; and forming a film including silicon, oxygen and nitrogen on the active layer by plasma CVD, wherein the substrate is not substantially exposed to an air atmosphere from the laser irradiating step to the film forming step; and wherein composition ratios of nitrogen at an interface between the film and the active layer and at a surface of the film not in contact with the active layer are larger than in other portions of the film.

2. The method of claim 1 wherein the film is a gate insulating film.

3. The method of claim 1 wherein a nitrogen content in the film is changed in a direction of a thickness of the film.

4. The method of claim 1 wherein the film is SiOxNy where 0<x<2 and 0<y<4/3, its energy band gap is 5.3 to 7.0 eV and its relative dielectric constant is 4 to 6.

5. The method of claim 1 further comprising the step of forming an insulating film including silicon, oxygen and nitrogen under the active layer.

6. The method of claim 1 wherein the active layer includes a metal element for promoting crystallization of the silicon.

7. The method of claim 6 wherein the metal element includes at least one selected from Ni, Fe, Co, Ru, Pd, Os, Ir, Pt, Cu, Ag and Au.

8. A method for producing a semiconductor device comprising the steps of:

forming an active layer on a substrate having an insulating surface;

irradiating a laser into the active layer in an atmosphere including at least one of oxygen, nitrogen and halogen element;

forming a film including silicon, oxygen and nitrogen on the active layer by plasma CVD; and forming a gate electrode on the film, wherein the substrate is not exposed to an air atmosphere from the laser irradiating step to the film forming step; and wherein composition ratios of nitrogen at interfaces between the film and the gate electrode and between the film and the active layer are larger than in other portions of the film.

9. The method of claim 8 wherein the film is SiOxNy where 0<x<2 and 0<y<4/3, its energy band gap is 5.3 to 7.0 eV and its relative dielectric constant is 4 to 6.

10. The method of claim 8 wherein a composition ratio of nitrogen at an interface between the film and the gate electrode is larger than at the interface between the film and the active layer.

11. A method for producing a semiconductor device, comprising the steps of:

forming an active layer on a substrate having an insulating surface;

irradiating a laser into the active layer in an atmosphere including at least one of oxygen, nitrogen and halogen element; and forming a gate insulating film including silicon, oxygen, nitrogen and chlorine, wherein a nitrogen content is changed in a direction of a thickness of the gate insulating film from the laser irradiating step to the gate insulating film forming step; and wherein composition ratios of nitrogen at an interface between the gate insulating film and the active layer and at a surface of the film not in contact with the active layer are larger than in other portions of the gate insulating film.

12. The method of claim 11 wherein the gate insulating film includes SiOxNy where 0<x<2 and 0<y<4/3, its energy band gap is 5.3 to 7.0 eV and its relative dielectric constant is 4 to 6.

13. A method for producing a semiconductor device comprising the steps of:

forming a crystalline silicon island region on a substrate;

forming a silicon oxide film on a surface of the island region by photo-annealing in an atmosphere including oxygen while thermally heating the substrate; and forming an insulating film including SiOxNy to cover the island region, wherein the substrate is not exposed to an air atmosphere from the silicon oxide film forming step to the insulating film forming step.

14. The method of claim 13 wherein 0<x<2 and 0<y<4/3, the insulating film energy band gap is 5.3 to 7.0 eV and the insulating film relative dielectric constant is 4 to 6.

15. The method of claim 13 wherein a composition ratio of nitrogen at an interface between the insulating film and the silicon oxide film is larger than in other portions of the insulating film.

16. A method for producing a semiconductor device comprising the steps of:

forming a crystalline silicon island region on a substrate;

forming a film comprising at least one of silicon nitride and silicon oxynitride on a surface of the island region by photo-annealing in an atmosphere including oxygen and nitrogen while heating the substrate; and forming an insulating film including SiOxNy to cover the island region, wherein the substrate is not exposed to an air atmosphere from the film forming step to the insulating film forming step.

17. The method of claim 16 wherein $0<x<2$ and $0<y<\frac{4}{3}$, the insulating film energy band gap is 5.3 to 7.0 eV and the insulating film relative dielectric constant is 4 to 6.

18. The method of claim 16 wherein a composition ratio of nitrogen at an interface between the insulating film and the film comprising at least one of silicon nitride and silicon oxynitride is larger than in other portions of the insulating film.

* * * * *